US009455687B2

(12) United States Patent
Gertenbach et al.

(10) Patent No.: US 9,455,687 B2
(45) Date of Patent: Sep. 27, 2016

(54) TUNING CIRCUIT

(75) Inventors: Johan Lucas Gertenbach, Cambridge (GB); Timothy John Newton, Suffolk (GB); Nicolas Sornin, La Tronche (FR); Oliver George Hylton Madge, Cambridge (GB); Michael John Story, Cambridgeshire (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 0 days.

(21) Appl. No.: 13/202,213

(22) PCT Filed: Feb. 19, 2010
(Under 37 CFR 1.47)

(86) PCT No.: PCT/EP2010/052164
§ 371 (c)(1),
(2), (4) Date: Apr. 25, 2012

(87) PCT Pub. No.: WO2010/094784
PCT Pub. Date: Aug. 26, 2010

(65) Prior Publication Data
US 2012/0268228 A1    Oct. 25, 2012

(30) Foreign Application Priority Data
Feb. 19, 2009   (GB) .................................. 0902837.4

(51) Int. Cl.
*H01F 21/12*    (2006.01)
*H01F 21/10*    (2006.01)
*H01F 30/14*    (2006.01)
*H03B 5/08*     (2006.01)
(Continued)

(52) U.S. Cl.
CPC .............. *H03J 3/20* (2013.01); *H03J 2200/15* (2013.01)

(58) Field of Classification Search
CPC ...... H01F 29/025; H01F 21/12; H01F 29/02; H01F 29/04; H01F 27/2828
USPC ........... 336/150, 87, 90, 10; 331/95, 96, 128
See application file for complete search history.

(56) References Cited

U.S. PATENT DOCUMENTS 1,893,675 A * 1/1933 Mahone .......................... 334/58
2,589,745 A * 3/1952 Stolze ........................... 455/285
(Continued)

FOREIGN PATENT DOCUMENTS

WO      2006/051514 A1    5/2006

OTHER PUBLICATIONS

International Search Report and Written Opinion—PCT/EP2010/052164—ISAEPO—May 28, 2010.

*Primary Examiner* — Elvin G Enad
*Assistant Examiner* — Kazi Hossain
(74) *Attorney, Agent, or Firm* — Procopio, Cory, Hargreaves & Savitch LLP

(57) ABSTRACT

A variable inductor structure for varying an inductance responsive to a digital tuning signal, comprising: a first inductor; a second, adjustable, inductor; and a digital control mechanism configured to receive the digital tuning signal and to adjust the effective inductance of the second inductor in response to the digital tuning signal; wherein the second inductor is positioned sufficiently close to the first inductor so as to be capable of altering by mutual inductance the effective inductance of the first inductor in dependence on the digital tuning signal.

22 Claims, 2 Drawing Sheets

(51) Int. Cl.
*H03B 5/18* (2006.01)
*H03B 11/08* (2006.01)
*H03J 3/20* (2006.01)

(56) References Cited

U.S. PATENT DOCUMENTS

| | | | | |
|---|---|---|---|---|
| 2,694,117 A * | 11/1954 | Bakke | | F02P 7/00 |
| | | | | 200/19.04 |
| 3,718,874 A * | 2/1973 | Cooper, Jr. | | H03H 7/0161 |
| | | | | 333/204 |
| 5,737,173 A * | 4/1998 | Ross et al. | | 361/160 |
| 5,872,489 A * | 2/1999 | Chang et al. | | 331/179 |
| 6,121,850 A * | 9/2000 | Ghoshal | | H03B 27/00 |
| | | | | 331/117 FE |
| 6,232,847 B1 * | 5/2001 | Marcy et al. | | 331/167 |
| 6,549,096 B2 * | 4/2003 | Groves et al. | | 333/174 |
| 7,091,784 B1 * | 8/2006 | Terrovitis | | 330/252 |
| 7,202,768 B1 * | 4/2007 | Harvey | | H01F 21/08 |
| | | | | 333/174 |
| 2005/0068146 A1 | 3/2005 | Jessie | | |
| 2006/0197642 A1 * | 9/2006 | Hargrove et al. | | 336/200 |
| 2007/0085617 A1 * | 4/2007 | Salerno | | 331/167 |
| 2007/0268007 A1 * | 11/2007 | El Rai | | 323/247 |
| 2008/0129434 A1 * | 6/2008 | Khajehpour | | 336/139 |
| 2008/0136572 A1 | 6/2008 | Ayazi et al. | | |
| 2010/0295625 A1 * | 11/2010 | Tanabe | | 331/117 FE |

* cited by examiner

1

TUNING CIRCUIT

FIELD OF THE INVENTION

This invention relates to varying an inductance responsive to a digital tuning signal. The present invention is particularly applicable to an inductor in an oscillator which forms part of a phase-locked loop, wherein the phase-locked loop applies a digital tuning signal to the oscillator to vary the oscillation frequency of the oscillator.

BACKGROUND OF THE INVENTION

A phase-locked loop is a circuit including a voltage controlled oscillator (VCO) which is designed to control the VCO to generate an output signal having a predetermined frequency and/or phase relationship with a reference signal. A typical phase-locked loop is shown in FIG. 1.

The phase-locked loop comprises an oscillator 101. The output of the oscillator is output from the phase-locked loop circuit on line 105. Additionally, the output of the oscillator 101 is fed via a divider 104 to an input of a phase/frequency detector (PFD) 102. The PFD 102 outputs a signal that is representative of the phase and/or frequency difference between a reference signal on line 106 and the signal output from the oscillator. The PFD output signal is filtered at a low pass filter 103. The output of the low pass filter 103 on line 107 is a voltage control signal that is suitable for use in controlling the oscillator to tune its resonant frequency to match the frequency of the reference signal.

Except for the VCO, the components of the phase locked-loop are suitably operable in the digital domain. The voltage tuning signal 107 output by the low pass filter 103 is a digital signal. The VCO operates in the analogue domain. In typical phase locked-loops the digital voltage tuning signal is input to a digital to analogue converter (DAC) 108. The DAC outputs an analogue voltage tuning signal on line 109. This analogue voltage tuning signal is applied to the oscillator. Suitably the oscillator comprises an inductor and a variable capacitor connected in parallel. The analogue voltage tuning signal is applied directly to the variable capacitor to modify the value of the capacitance of the capacitor.

On application of a current, the inductor and capacitor generate an oscillating signal at their resonant frequency, given by:

$$f = 1/2\pi\sqrt{LC} \quad \text{(equation 1)}$$

where f is the resonant frequency, L is the inductance of the inductor and C is the capacitance of the capacitor. Standard units apply. In accordance with this equation, modifying the capacitance, C, modifies the resonant frequency of the oscillating signal.

A problem with the phase-locked loop of FIG. 1 is that the voltage tuning signal picks up noise as it passes through the DAC. It is therefore preferable to tune the oscillation frequency of the oscillator without having to convert the digital tuning signal to an analogue tuning signal.

EP 1143606 describes a mechanism for tuning the oscillation frequency of a VCO directly using a digital tuning signal. The VCO comprises a crystal resonator connected to two capacitor banks. Each capacitor bank includes a number of capacitors connected to the resonator via switching devices. The oscillation frequency of the VCO depends on the capacitance provided by the capacitor banks. The capacitance of each capacitor bank is selected by enabling or disabling the switching devices connected to the capacitors in dependence on a digital tuning signal applied from the phase-locked loop. If the desired capacitance can not be achieved by enabling a combination of the capacitors in the bank, then a sigma delta modulator is additionally employed. The sigma delta modulator enables one capacitor in the capacitor bank for a portion of a clock cycle and disables it for the remaining portion of the clock cycle. Over time, the capacitance of that capacitor averages to a value that is less than its instantaneous value. The ratio of the time for which the capacitor is enabled to the time for which the capacitor is disabled can be adjusted such that the desired fractional capacitance is achieved. The capacitance of the capacitor banks can therefore be fine tuned so that the oscillation frequency is matched to the reference frequency.

One problem with this mechanism is that the capacitors in the capacitor banks need to be initially very accurately calibrated in order that they can be used to precisely tune the oscillation frequency.

There is a need for an improved design for digitally controlling a VCO which has the advantage of enabling precise tuning of the oscillation frequency without the disadvantage of requiring extensive initial calibration. Additionally, there is a need for a design which is suitable for integration onto a single chip.

SUMMARY OF THE INVENTION

According to a first aspect of the invention, there is provided a variable inductor structure for varying an inductance responsive to a digital tuning signal, comprising: a first inductor; a second, adjustable, inductor; and a digital control mechanism configured to receive the digital tuning signal and to adjust the effective inductance of the second inductor in response to the digital tuning signal; wherein the second inductor is positioned sufficiently close to the first inductor so as to be capable of altering by mutual inductance the effective inductance of the first inductor in dependence on the digital tuning signal.

Suitably, the digital control mechanism comprises switching logic and a plurality of switching devices, the switching logic being configured to receive the digital tuning signal and to control activation and deactivation of the switching devices in response to the digital tuning signal, and each switching device being connected to the second inductor and being configured on activation or deactivation to adjust the effective inductance of the second inductor.

Suitably, the switching devices are connected to the second inductor such that on activation of one switching device the effective area enclosed by the second inductor in the plane of the area enclosed by the first inductor is different to the effective area enclosed by the second inductor in the plane of the area enclosed by the first inductor on activation of a different switching device.

Suitably, the switching devices are connected to the second inductor such that on activation of one switching device the effective separation of the first inductor and the second inductor is different to the effective separation of the first inductor and the second inductor on activation of a different switching device.

Suitably, the second inductor comprises a first inductor section and a second inductor section, an input of each switching device being connected to the first inductor section and an output of each switching device being connected to the second inductor section so as to on activation connect part of the first and second inductor sections to form a closed circuit, the effective inductance of the second inductor being dependent on the inductance of the closed circuit.

Suitably, the second inductor comprises inductor sections connected in series by switching devices, such that on activation of a switching device a closed circuit comprising one of the inductor sections is formed, the effective inductance of the second inductor being dependent on the inductance of the closed circuit.

Suitably, the inductor structure is configured such that on activation of only one switching device the effective inductance of the second inductor is the inductance of the closed circuit comprising the one switching device.

Suitably, a switching device is configured to be activated and deactivated over a time interval so that the effective inductance of the second inductor averaged over the time interval is lower than the instantaneous effective inductance of the second inductor when the switching device is activated.

Suitably, the first inductor is parallel to the second inductor.

Suitably, the first inductor section of the second inductor is parallel to the second inductor section of the second inductor.

Suitably, an oscillator comprises the inductor structure, wherein the oscillator is configured to output a signal at an oscillation frequency controlled by the digital tuning signal.

Suitably, an integrated circuit comprises the inductor structure.

According to a second aspect of the invention, there is provided a method for varying an inductance responsive to a digital tuning signal, comprising: receiving at a digital control mechanism the digital tuning signal and adjusting the effective inductance of a second inductor in response to the digital tuning signal, wherein the second inductor is positioned sufficiently close to a first inductor so as to alter by mutual inductance the effective inductance of the first inductor in dependence on the digital tuning signal.

Suitably, switching logic of the digital control mechanism receives the digital tuning signal and in response to the digital tuning signal controls activation and deactivation of switching devices of the digital control mechanism, wherein each switching device adjusts on activation or deactivation the effective inductance of the second inductor.

Suitably, activating one switching device causes the second inductor to enclose an effective area in the plane of the area enclosed by the first inductor, and activating a different switching device causes the second inductor to enclose a different effective area in the plane of the area enclosed by the first inductor.

Suitably, activating one switching device causes an effective separation of the first inductor and the second inductor, and activating a different switching device causes a different effective separation of the first inductor and the second inductor.

Suitably, the method comprises activating and deactivating a switching device over a time interval such that the effective inductance of the second inductor averaged over the time interval is lower than the instantaneous effective inductance of the second inductor when the switching device is activated.

BRIEF DESCRIPTION OF THE DRAWINGS

The present invention will now by described by way of example with reference to the accompanying drawings. In the drawings.

DESCRIPTION OF THE PREFERRED EMBODIMENTS

Figure 2:
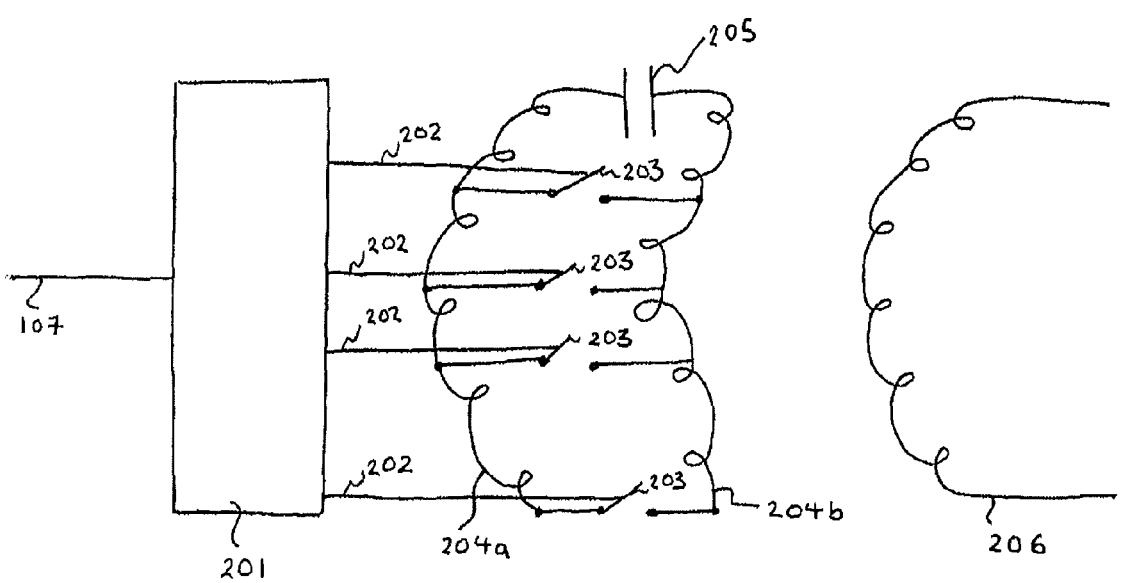
FIG. 2 is a schematic diagram of a circuit for digitally tuning an inductor of an oscillator.

FIG. 2 shows a schematic diagram of the general arrangement of a circuit for digitally tuning a first inductor 206 by applying a digital tuning signal to a second inductor 204. Preferably, all the components of the circuit are formed on a single integrated circuit. Alternatively, they could be implemented wholly or partly through discrete components.

A digital tuning signal on line 107 is input to switching logic 201. Switching logic 201 outputs activating/deactivating signals on lines 202 to each of a plurality of switching devices 203. Suitably, the switching devices are implemented using active devices such as MOSFETs. The second inductor 204 comprises two inductor sections 204a, 204b connected to each other at one end by a capacitor 205 and at the other end by a switching device 203. The inductor sections may be parallel to each other. The inductor sections may be parallel to a straight line. Alternatively, the inductor sections may be curved as shown in FIG. 2. The input of each switching device 203 is connected to a point along the length of the first inductor section 204a, and the output of each switching device 203 is connected to a point along the length of the second inductor section 204b. The first inductor 206 is not physically connected to the second inductor 204. The first inductor 206 is positioned sufficiently close to the second inductor 204 that appreciable electromagnetic coupling occurs between the two inductors.

Figure 1:
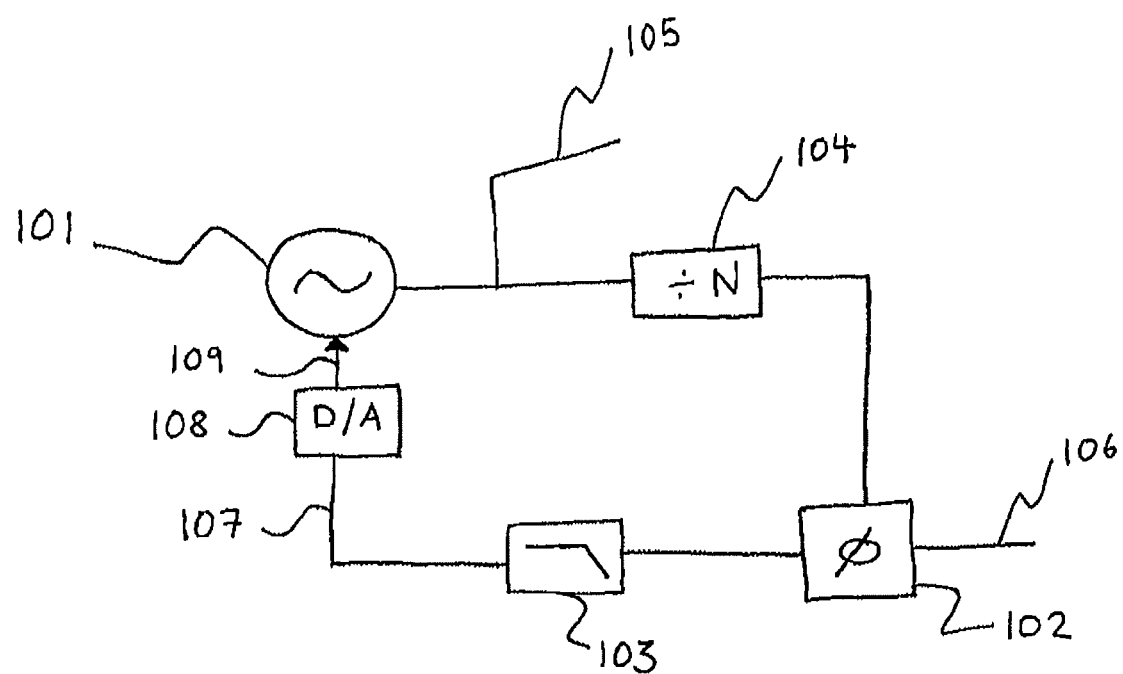
FIG. 1 is a schematic diagram of a typical phase-locked loop.

Suitably, the first inductor 206 forms part of an oscillator, the oscillation frequency of which is controlled by the digital tuning signal on line 107. The oscillator may comprise the first inductor 206 and a capacitor connected in parallel to the first inductor. In such an oscillator, when current is applied the inductor and capacitor generate an oscillating signal at their resonant frequency, given by:

$$f = 1/2\pi\sqrt{LC} \qquad \text{(equation 1)}$$

where f is the resonant frequency, L is the inductance of the inductor and C is the capacitance of the capacitor. Standard units apply. In accordance with this equation, modifying the inductance, L, modifies the resonant frequency of the oscillating signal. The oscillator may be a voltage controlled oscillator in a phase-locked loop similar to the phase-locked loop depicted in FIG. 1, except that the digital tuning signal 107 is not converted to an analogue tuning signal before being applied to the oscillator 101. Instead, the digital tuning signal is used directly to tune the first inductor 206 using the tuning circuit of FIG. 2.

In operation, the digital tuning signal is applied on line 107 to the switching logic 201. The switching logic uses the digital tuning signal to form activating/deactivating signals which it outputs to the switching devices 203 on lines 202. When an activating signal is received by a switching device, the switching device is enabled to connect the point of the first inductor section of the second inductor 204a to which the input of the switching device is connected to the point of the second inductor section of the second inductor 204b to which the output of the switching device is connected. When a deactivating signal is received by a switching device it is enabled to disconnect these two points.

When a switching device is activated (whilst the other switching devices are deactivated), a closed circuit is formed comprising the switching device, the capacitor 205, the part of the first inductor section of the second inductor that is connected to both the capacitor and the input of the switching device, and the part of the second inductor section of the second inductor that is connected to both the capacitor and the output of the switching device. This circuit has an inductance that depends on the length of the inductor sections in the circuit. If only one switching device is enabled, then the effective inductance of the second inductor 204 is given by the inductance of the inductor sections in the closed circuit comprising that switching device. This is because the other ends of the second inductor are effectively open, and therefore an electromagnetic field incident on the second inductor will induce a current in the closed circuit and not in the rest of the second inductor. By activating and deactivating different ones of the switching devices 203, the length of the second inductor that contributes to the effective inductance of the second inductor is changed.

Mutual inductance is a measure of the electromagnetic coupling between two inductors. The mutual inductance of the first and second inductors is given by the double integral Neumann formula:

$$M_{ij} = \frac{\mu_0}{4\pi} \oint_{C_i} \oint_{C_j} \frac{ds_i \cdot ds_j}{|R_{ij}|} \quad \text{(equation 2)}$$

$M_{ij}$ is the mutual inductance, $\mu_0$ is the permeability of free space, $C_i$ and $C_j$ are the curves spanned by the two inductors, $R_{ij}$ is the distance between two points i and j, one point on one inductor and the other point on the other inductor. Standard units apply. In other words, the mutual inductance of the two inductors is dependent on the projection of the areas enclosed by the first and second inductors onto a common plane (the areas of the two inductors that face each other), and on the distance between the two inductors.

By deactivating a first switching device and activating a second switching device, the length of the effective second inductor (the part of the second inductor switched into a closed circuit by a switching device) can be changed resulting in a change in one of the curves ($C_i$) integrated over in the calculation of the mutual inductance. This changes the effective area of the second inductor that contributes to the effective inductance of the second inductor, where the effective area of the second inductor is the area enclosed by the part of the second inductor that is switched into a closed circuit by a switching device. It also changes the effective separation of the first and second inductors, where the effective separation of the first and second inductors depends on the integral of the $R_{ij}$ components in equation 2 over the part of the second inductor that is switched into a closed circuit by a switching device. Consequently, deactivating a first switching device and activating a second switching device changes the mutual inductance between the first and second inductors. The effective inductance of the first inductor is dependent on the mutual inductance of the two inductors. The effective inductance of the first inductor is consequently modified as a result of activating/deactivating the switching devices under the control of the digital tuning signal. The relationship between the mutual inductance of the two inductors and the effective inductance of the first inductor is a function of a number of factors including magnetic coupling between the inductors, the quality factors of both inductances and the load on the alternate inductance. Practically, it is likely that the first inductor will have a higher inductance than the second inductor. The coupling between the first inductor and second inductor acts to pull the resonant frequency of each inductor toward the resonant frequency of the other inductor. Since the first inductor has the higher inductance its resonance frequency will be slightly increased by coupling to the second inductor.

The switching devices 203 may be equally spaced along the length of the second inductor. Alternatively, the switching devices may be unevenly spaced along the length of the second inductor. The positions of the switching devices are selected so as to be able to effect the desired precision of tuning of the first inductor. The finer the tuning of the first inductor required, the more closely spaced the switching devices.

The closed circuits formed by the second inductor 204 and the switching devices 203 are not connected to a current or voltage source. Current flows around these circuits as a result of being induced. The first inductor 206 suitably forms part of an oscillator that is connected to a current/voltage source. When current flows around the first inductor 206, the first inductor induces a current in the second inductor 204 such that the inductors are coupled by mutual inductance as described above. As current flows around the second inductor 204, the second inductor couples to the first inductor 206 in the same manner. By controlling the effective inductance of the second inductor as explained above, the mutual coupling (mutual inductance) of the first and second inductors can be controlled so as to control the effective inductance of the first inductor. The resonant frequency of the oscillator can therefore be controlled with the digital tuning signal on line 107 by using the digital tuning signal to modify the mutual inductance between the first and second inductors so as to modify the effective inductance of the first inductor which alters the resonant frequency of the oscillator in line with equation 1.

The second inductor must be positioned sufficiently close to the first inductor for it to be possible to controllably alter the effective inductance of the first inductor as a result of changes in the effective inductance of the second inductor. If the first and second inductors were positioned too far apart then there would be no appreciable mutual inductance between the two inductors as can be seen from equation 2 above (R would be large causing M to be small). The differences in the effective inductance of the first inductor caused by changes in the length of the second inductor would be too small to reliably control in a practical arrangement. The larger the second inductor, the larger the spacing between the inductors that can be used and an appreciable coupling still experienced. However, it is desirable for chip area saving reasons amongst others for the second inductor to be small.

It may be desirable for the second inductor to be shaped differently to that depicted in FIG. 2. The most suitable shape for the second inductor depends on the shape of the first inductor since the nature of the coupling between the two inductors depends on their relative shapes. This can be seen from equation 2 since the dot product in the integral indicates that only the components of the areas of each inductor that are facing each other are considered. Additionally, it may be desirable for the second inductor to be shaped so as to limit its on-chip area.

In FIG. 2 the second inductor comprises a first section 204a and a second section 204b connected by a capacitor 205 and switching devices 203. Each of the first and second sections can be considered to comprise a number of sub-sections of inductor. The sub-sections of inductor are separated by the points at which the switching devices are connected to the second inductor. Each sub-section contributes to the effective inductance of the second inductor at a time when the relevant switching device is activated. The sub-sections of inductor are connected to each other in series. The switching devices lie in parallel with each other. Alternatively, the sub-sections of the second inductor could be connected in parallel. The switching devices could be connected in series.

The tuning circuit of FIG. 2 is suitable for use in tuning an oscillator comprising the first inductor, the oscillator being used to output an oscillating signal to drive a frequency mixer used in a transmitter, receiver or a transceiver. The frequency mixer may be used, for example, to upconvert a signal in a transmit chain and/or to downconvert a signal in a receive chain. The oscillator can form part of a phase-locked loop, such as the one shown in FIG. 1. If the transmitter/receiver/transceiver transmits/receives frequency hopping signals, the phase-locked loop can suitably be used to generate frequency hopping oscillating signals with the desired hopping sequence to combine with the signal to be upconverted/downconverted. Transmitters/receivers/transceivers operating in accordance with the Bluetooth specifications use frequency hopping signals which hop over 79 different frequencies. The tuning circuit is suitable for use in generating such signals.

Due to the strong dependence of the mutual inductance on the separation of the inductors and the projection of the areas enclosed by the inductors on a common plane (see equation 2), the tuning circuit described herein can reliably manufacture very small increments in the inductance of the inductors. The overall range of inductor values, and the ratio of the inductance of the first inductor to the increment in the inductance of the second inductor are much greater than in prior art tuning circuits that operate by switching sections of capacitor into an oscillator. Such prior art tuning circuits use dithering or analogue fine tuning in order to achieve a fine frequency resolution in the oscillation frequency. The tuning circuit described herein achieves a comparable fine frequency resolution without using dithering.

If even finer frequency resolution is desired then dithering may be applied. This involves switching a sub-section of the second inductor in for a portion of a clock cycle and switching it out for the remaining portion of the clock cycle by activating and deactivating the relevant switching device. This has the effect of changing quickly the curve of the second inductor used for integrating over in equation 2. The mutual inductance changes quickly, but averages to a value that is less than its instantaneous value when the sub-section of the second inductor is switched in. The ratio of the time for which the sub-section of the second inductor is switched in to the time for which the sub-section of the second inductor is switched out can be adjusted such that the desired mutual inductance is achieved. The effective inductance of the first inductor can therefore be more precisely fine tuned using this dithering method.

Suitably, the first inductor has a layout in the shape of a figure-of-8 inductor. The second inductor lies next to a section of the figure-of-8 inductor and parallel to it.

Suitably, the first and second inductors are fabricated by metallisation on a planar substrate.

The control of the oscillator by the digital control signal on line 107 is carried out in real time, in other words whilst the chip is in operation.

The applicant draws attention to the fact that the present invention may include any feature or combination of features disclosed herein either implicitly or explicitly or any generalisation thereof, without limitation to the scope of any of the present claims. In view of the foregoing description it will be evident to a person skilled in the art that various modifications may be made within the scope of the invention.

The invention claimed is:

1. A variable inductor structure for varying an inductance responsive to a digital tuning signal, comprising:
   a first inductor;
   a second, adjustable, inductor, the second inductor comprising
      a first inductor section comprising a plurality of sub-sections, and
      a second inductor section comprising a plurality sub-sections;
   wherein the second inductor is positioned sufficiently close to the first inductor so as to be capable of altering by mutual inductance the effective inductance of the first inductor in dependence on the digital tuning signal;
   a capacitor coupled to a first end of the first inductor section and to a first end of the second inductor section; and
   a digital control mechanism comprising
      a plurality of switching devices, each of the plurality of switching devices being coupled between the first inductor section and the second inductor section, a first one of the plurality of switching devices being coupled between a point between sub-sections of the first inductor section and a point between sub-sections of the second inductor section, a second one of the plurality of switching devices being coupled between a second end of the first inductor section and a second end of the second inductor section, and
      switching logic being configured to receive the digital tuning signal and to control activation and deactivation of the plurality of switching devices based on the digital tuning signal.

2. A variable inductor structure as claimed in claim 1, wherein the switching devices are connected to the second inductor such that on activation of one switching device the effective area enclosed by the second inductor in the plane of the area enclosed by the first inductor is different to the effective area enclosed by the second inductor in the plane of the area enclosed by the first inductor on activation of a different switching device.

3. A variable inductor structure as claimed in claim 1, wherein the switching devices are connected to the second inductor such that on activation of one switching device the effective separation of the first inductor and the second inductor is different to the effective separation of the first inductor and the second inductor on activation of a different switching device.

4. A variable inductor structure as claimed in claim 1, configured such that on activation of only one switching device the effective inductance of the second inductor is the inductance of the closed circuit comprising the one switching device.

5. A variable inductor structure as claimed in claim 1, wherein the switching logic of the digital control mechanism is further configured to control activation and deactivation of at least one of the plurality of switching devices is activated and deactivated over a time interval so that the effective inductance of the first inductor over the time interval is an average value.

6. A variable inductor structure as claimed in claim 1, wherein the first inductor is parallel to the second inductor.

7. A variable inductor structure as claimed in claim 1, wherein the first inductor section of the second inductor is parallel to the second inductor section of the second inductor.

8. An oscillator comprising the variable inductor structure of claim 1, wherein the oscillator is configured to output a signal at an oscillation frequency controlled by the digital tuning signal.

9. An integrated circuit comprising the variable inductor structure as claimed in claim 1.

10. A method for varying an inductance responsive to a digital tuning signal, comprising:
receiving at a digital control mechanism the digital tuning signal and adjusting the effective inductance of a second inductor in response to the digital tuning signal, wherein the second inductor is positioned sufficiently close to a first inductor so as to alter by mutual inductance the effective inductance of the first inductor in dependence on the digital tuning signal,
wherein switching logic of the digital control mechanism receives the digital tuning signal and in response to the digital tuning signal controls activation and deactivation of switching devices of the digital control mechanism, wherein each switching device adjusts on activation or deactivation the effective inductance of the second inductor,
wherein the second inductor comprises a first inductor section and a second inductor section connected to each other via a capacitor, the capacitor being connected in series with the first and second inductor sections, an input of each switching device being connected to the first inductor section and an output of each switching device being connected to the second inductor section so as to on activation connect part of the first and second inductor sections to form a closed circuit with the capacitor, the activated switch, and corresponding parts of the first and second inductor sections coupled in series, the effective inductance of the second inductor being equal to the inductance of the formed closed circuit, and
wherein the input of at least one of the plurality of switching devices is connected to a point along a length of the first section and the output of said at least one switching device is connected to a point along a length of the second section, so as to define sub-sections within each of the first and second sections.

11. A method for varying an inductance as claimed in claim 10, wherein activating one switching device causes the second inductor to enclose an effective area in the plane of the area enclosed by the first inductor, and activating a different switching device causes the second inductor to enclose a different effective area in the plane of the area enclosed by the first inductor.

12. A method for varying an inductance as claimed in claim 10, wherein activating one switching device causes an effective separation of the first inductor and the second inductor, and activating a different switching device causes a different effective separation of the first inductor and the second inductor.

13. A method for varying the inductance as claimed in claim 11, comprising activating and deactivating a switching device over a time interval such that the effective inductance of the second inductor averaged over the time interval is lower than the instantaneous effective inductance of the second inductor when the switching device is activated.

14. A variable inductor structure as claimed in claim 2, wherein a switching device is configured to be activated and deactivated over a time interval so that the effective inductance of the second inductor averaged over the time interval is lower than the instantaneous effective inductance of the second inductor when the switching device is activated.

15. An oscillator comprising the variable inductor structure of claim 2, wherein the oscillator is configured to output a signal at an oscillation frequency controlled by the digital tuning signal.

16. An oscillator comprising the variable inductor structure of claim 5, wherein the oscillator is configured to output a signal at an oscillation frequency controlled by the digital tuning signal.

17. An integrated circuit comprising the variable inductor structure as claimed in claim 2.

18. An integrated circuit comprising the variable inductor structure as claimed in claim 5.

19. A variable inductor structure for varying an inductance responsive to a digital tuning signal, comprising:
a first inductor;
a second, adjustable, inductor; and
a digital control mechanism configured to receive the digital tuning signal and to adjust the effective inductance of the second inductor in response to the digital tuning signal;
wherein the second inductor is positioned sufficiently close to the first inductor so as to be capable of altering by mutual inductance the effective inductance of the first inductor in dependence on the digital tuning signal,
wherein the digital control mechanism comprises switching logic and a plurality of switching devices, the switching logic being configured to receive the digital tuning signal and to control activation and deactivation of the switching devices in response to the digital tuning signal, each switching device being connected to the second inductor and being configured on activation or deactivation to adjust the effective inductance of the second inductor,
wherein the second inductor comprises a first inductor section and a second inductor section connected to each other via a capacitor, the capacitor being connected in series with the first and second inductor sections, an input of each switching device being connected to the first inductor section and an output of each switching device being connected to the second inductor section so as to on activation connect part of the first and second inductor sections to form a closed circuit with the capacitor, the activated switch, and corresponding parts of the first and second inductor sections coupled in series, the effective inductance of the second inductor being equal to the inductance of the formed closed circuit.

20. A variable inductor structure as claimed in claim 1, wherein the second inductor is not connected to a voltage source.

21. A variable inductor structure as claimed in claim 1, wherein the second inductor is not connected to a current source.

22. A variable inductor structure as claimed in claim 21, wherein the second inductor is not connected to a voltage source.

* * * * *